United States Patent
Allen et al.

(10) Patent No.: US 6,819,540 B2
(45) Date of Patent: Nov. 16, 2004

(54) DIELECTRIC STRUCTURE

(75) Inventors: Craig S. Allen, Shrewsbury, MA (US); Maria Anna Rzeznik, Framingham, MA (US); David L. Jacques, Northbridge, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/268,270

(22) Filed: Oct. 10, 2002

(65) Prior Publication Data

US 2003/0128496 A1 Jul. 10, 2003

Related U.S. Application Data

(60) Provisional application No. 60/333,382, filed on Nov. 26, 2001.

(51) Int. Cl.[7] ................................. H01G 4/35
(52) U.S. Cl. ...................... 361/302; 361/303; 361/311; 361/313; 361/321.1; 361/306.3
(58) Field of Search .................. 361/302, 303–305, 361/308.1, 311, 313, 306.1, 306.3, 321.1, 321.4, 308, 309, 310, 312

(56) References Cited

U.S. PATENT DOCUMENTS

| | | | |
|---|---|---|---|
| 4,455,590 A | 6/1984 | Alexander | |
| 5,155,655 A | 10/1992 | Howard et al. | |
| 5,246,732 A | 9/1993 | Van Der Putten | |
| 5,390,072 A | 2/1995 | Anderson et al. | |
| 5,429,972 A | 7/1995 | Anjum et al. | |
| 5,466,964 A | * 11/1995 | Sakao et al. | ................ 257/532 |
| 5,742,471 A | 4/1998 | Barbee, Jr. et al. | |
| 5,776,990 A | 7/1998 | Hedrick et al. | |
| 5,783,253 A | * 7/1998 | Roh | ............................ 427/81 |
| 5,835,174 A | 11/1998 | Clikeman et al. | |
| 5,895,263 A | 4/1999 | Carter et al. | |
| 6,068,782 A | 5/2000 | Brandt et al. | |
| 6,093,636 A | 7/2000 | Carter et al. | |
| 6,180,252 B1 | 1/2001 | Farrell et al. | |
| 6,215,649 B1 | 4/2001 | Appelt et al. | |
| 6,270,835 B1 | 8/2001 | Hunt et al. | |
| 6,271,273 B1 | 8/2001 | You et al. | |
| 6,288,906 B1 | * 9/2001 | Sprietsma et al. | .......... 361/772 |
| 6,404,081 B1 | 6/2002 | Staffiere | |
| 6,420,441 B1 | 7/2002 | Allen et al. | |
| 6,657,849 B1 | * 12/2003 | Andresakis et al. | ........ 361/311 |
| 2001/0019884 A1 | 9/2001 | Miller et al. | |
| 2001/0024387 A1 | 9/2001 | Raaijmakers et al. | |

FOREIGN PATENT DOCUMENTS

| | | |
|---|---|---|
| EP | 0 448 781 A2 | 10/1991 |
| EP | 0 899 053 A2 | 3/1999 |
| EP | 1 088 848 | 4/2001 |
| WO | WO 99/60689 | 11/1999 |
| WO | WO 01/67465 A2 | 9/2001 |

\* cited by examiner

Primary Examiner—Chau N. Nguyen
Assistant Examiner—Nguyen T. Ha
(74) Attorney, Agent, or Firm—S. Matthew Cairns

(57) ABSTRACT

Dielectric structures particularly suitable for use in capacitors and having a textured surface are provided, together with methods of forming these structures. Such dielectric structures show increased adhesion of subsequently applied conductive layers.

18 Claims, 1 Drawing Sheet

DIELECTRIC STRUCTURE

This application claims the benefit of provisional application no. 60/333,382, filed on Nov. 26, 2001.

BACKGROUND OF THE INVENTION

The present invention relates generally to the field of dielectric structures. In particular, the present invention relates to the field of dielectric structures suitable for use in capacitor manufacture.

Laminated printed circuit boards, as well as multichip modules, serve as support substrates for electronic components, such as integrated circuits, capacitors, resistors, inductors, and other components. Conventionally, discrete passive components, e.g. resistors, capacitors and inductors, are surface mounted to the printed circuit boards. Such discrete passive components can occupy up to 60% or greater of the real estate of a printed circuit board, thus limiting the space available for the mounting of active components, such as integrated circuits. The removal of passive components from the printed circuit board surface allows for increased density of active components, further miniaturization of the printed circuit board, increased computing power, reduced system noise and reduced noise sensitivity due to shortened leads.

Such removal of discrete passive components from the printed circuit board surface can be achieved by embedding the passive components within the laminated printed circuit board structure. Embedded capacitance has been discussed in the context of capacitive planes providing non-individual or "shared" capacitance. Capacitive planes consist of two laminated metal sheets insulated by a polymer based dielectric layer. Shared capacitance requires the timed use of the capacitance by other components. Such shared capacitance fails to adequately address the need for embedded capacitors that still function as discrete components.

U.S. Pat. No. 6,068,782 (Brandt et al.) discloses a method of providing individual embedded capacitors including the steps of patterning a photoimageable low dielectric constant material on top of a bottom electrode material, depositing capacitance dielectric material by either filling or partially filling the pattern, and then fabricating a capacitor top electrode. Such capacitor dielectric material typically has a high dielectric constant, such as a ceramic or metal oxide. One problem with using such ceramics or metal oxides is that they may be difficult to metallize, i.e. to fabricate an electrode on, using techniques conventionally used in the printed circuit board industry.

U.S. Pat. No. 6,180,252 B1 (Farrell et al.) discloses high energy storage devices for use in semiconductors. This patent discloses conformally coating a dielectric material on a silicon substrate where the silicon substrate is three-dimensional. In this way, the surface of the dielectric material remains smooth and not textured.

There is a need for capacitors, particularly embeddable capacitors, having high dielectric constant capacitance dielectric material that are easier to fabricate electrodes on than conventional high dielectric constant capacitance dielectric material.

SUMMARY OF THE INVENTION

It has been surprisingly found that the adhesion of plated electrode layers to high dielectric constant material can be improved by providing increased surface roughness of the dielectric material. Such increased surface roughness is preferably provided through the use of removable porogens.

The present invention provides a capacitor structure including a first conductive layer, a second conductive layer and a multilayer dielectric structure disposed between the first and second conductive layers, wherein the multilayer dielectric structure includes a first dielectric layer and a second dielectric layer, wherein the first dielectric layer has a textured surface. Preferably, the textured surface of the first dielectric layer is in intimate contact with the first conductive layer.

The present invention also provides a method of improving the adhesion of a plated conductive layer to a dielectric structure including the steps of depositing on a dielectric layer a top dielectric layer comprising porogen, removing the porogen to provide a textured surface on the top dielectric layer, and depositing a conductive layer on the textured surface of the top dielectric layer.

Additionally, the present invention provides a printed circuit board including an embedded capacitance material, wherein the embedded capacitance material includes the multilayer dielectric structure described above.

Further, the present invention provides a method of manufacturing a multilayer laminated printed circuit board including the step of embedding a capacitance material in one or more layers of the multilayer laminated printed circuit board, wherein the embedded capacitance material includes the multilayer dielectric structure described above.

DETAILED DESCRIPTION OF THE INVENTION

Figure 1:
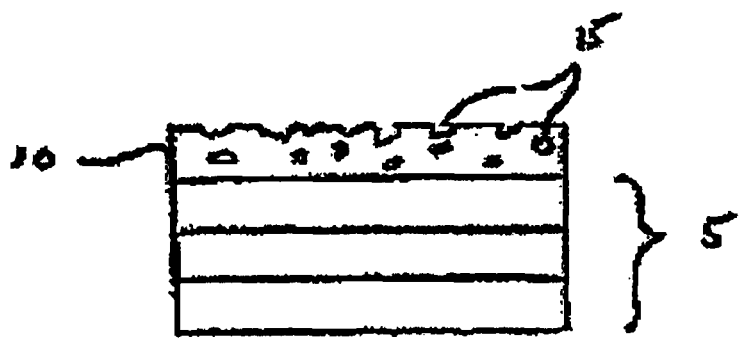
FIG. 1 illustrates a dielectric structure of the present invention having a first dielectric layer having a textured surface, not to scale.

As used throughout this specification, the following abbreviations shall have the following meanings, unless the context clearly indicates otherwise: ° C.=degrees Centigrade; rpm=revolutions per minute; mol=moles; hr=hours; min=minute; sec=second; nm=nanometers; cm=centimeters; in.=inches; and wt %=percent by weight.

The terms "printed wiring board" and "printed circuit board" are used interchangeably throughout this specification. "Depositing" and "plating" are used interchangeably throughout this specification and include both electroless plating and electrolytic plating. The term "(meth)acrylic" includes both acrylic and methacrylic and the term "(meth)acrylate" includes both acrylate and methacrylate. Likewise, the term "(meth)acrylamide" refers to both acrylamide and methacrylamide. "Alkyl" includes straight chain, branched and cyclic alkyl groups. The term "porogen" refers to a pore forming material, that is a polymeric material dispersed in a dielectric material that is subsequently removed to yield pores, voids or free-volume in the dielectric material. Thus, the term "removable porogen" will be used interchangeably with "removable polymer" or "removable particle" throughout this specification. The terms "pore" and "void" are used interchangeably throughout this specification. "Cross-linker" and "cross-linking agent" are used interchangeably throughout this specification. "Multilayer" refers to two or more layers. The term "dielectric structure" refers to a layer or layers of dielectric material.

All percentages are by weight, unless otherwise noted. All numerical ranges are inclusive and combinable in any order, except where it is clear that such numerical ranges are constrained to add up to 100%.

The present invention provides a capacitor structure including a first conductive layer, a second conductive layer and a multilayer dielectric structure disposed between the first and second conductive layers, wherein the multilayer dielectric structure has a top and bottom surface, wherein at least one of the top and bottom surfaces is textured. Preferably, such textured surface is in intimate contact with at least one of the first and second conductive layers. "Textured" refers to a surface having sufficient irregularities or topography to provide increased adhesion of subsequently applied electrode or conductive layers. Suitable topographies include, but are not limited to, channels, ridges, pores or voids, depressions, grooves, nooks, and crannies. A textured surface may include more than one type of topography. Such dielectric structures are particularly suitable for the fabrication of capacitors, and more particularly for the fabrication of capacitors that can be embedded within a laminated printed circuit board. Such capacitors contain a pair of electrodes (conductive layers or metal layers) on opposite sides of and in intimate contact with the capacitor dielectric material.

Typically, the dielectric material useful in the present dielectric structures is any that is suitable for use as capacitor dielectric material, i.e. has a high dielectric constant. By "high" dielectric constant it is meant a dielectric constant $\geq 7$, and preferably >7. When a multilayer dielectric structure is used, it is preferred that the structure has a dielectric constant $\geq 7$, and preferably >7. A wide variety of dielectric materials may suitably be used, including, but not limited to, polymers, ceramics, metal oxides and combinations thereof. Suitable polymers include, but are not limited to, epoxies, polyimides, polyurethanes, polyarylenes including polyarylene ethers, polysulfones, polysulfides, fluorinated polyimides, and fluorinated polyarylenes. Suitable ceramics and metal oxides include, but are not limited to, titanium dioxide ("$TiO_2$"), tantalum oxides such as $Ta_2O_5$, barium-titanates having the formula $Ba_aTi_bO_c$ wherein a and b are independently from 0.75 to 1.25 and c is 2.5 to 5, strontium-titanates such as $SrTiO_3$, barium-strontium-titanates, lead-zirconium-titanates such as $PbZr_yTi_{1-y}O_3$, the series of doped lead-zirconium-titanates having the formula $(Pb_xM_{1-x})(Zr_yTi_{1-y})O_3$ where M is any of a variety of metals such as alkaline earth metals and transition metals such as niobium and lanthanum, where x denotes lead content and y denotes zirconium content, lithium-niobium oxides such as $LiNbO_3$, lead-magnesium-titanates such as $(Pb_xMg_{1-x})TiO_3$, and lead-magnesium-niobium oxides such as $(Pb_xMg_{1-x})NbO_3$ and lead-strontium titanates $(Pb_xSr_{1-x})TiO_3$. When the capacitor dielectric material includes $Ba_aTi_bO_c$, it is preferred that a and b are both 1 and c is 3, i.e. $BaTiO_3$. It is preferred that the dielectric material includes a ceramic or metal oxide. Such dielectric materials may be used in a variety of crystal structures including, without limitation, perovskites ($ABO_3$), pyrochlores ($A_2B_2O_7$), rutile and other structural polymorphs that have suitable electrical properties for use as a capacitor dielectric.

When a polymer/ceramic or metal oxide composite capacitor dielectric material is used, the ceramic or metal oxide material may be blended as a powder with the polymer. When the ceramic or metal oxide is used without a polymer, such ceramic or metal oxide may be deposited by a variety of means, such as, but not limited to, sol-gel, physical and/or reactive evaporation, sputtering, laser-based deposition techniques, chemical vapor deposition ("CVD"), combustion chemical vapor deposition ("CCVD"), controlled atmosphere combustion chemical vapor deposition ("CACCVD"), hydride vapor phase deposition, liquid phase epitaxy, and electro-epitaxy. Preferably, such ceramic or metal oxide material is deposited as using sol-gel techniques.

In such sol-gel processes, as exemplified herein by the deposition of a barium titanate capacitor dielectric, a non-aqueous solution of titanium alkoxide is reacted with a barium precursor at the desired stoichiometry and controllably hydrolyzed with a solvent/water solution. A thin, adherent film of the hydrolyzed alkoxide solution (or "sol") is then applied to the substrate by either dip-coating or spin-coating at 1,000 to 3,000 rpm. Multiple coatings may be required for increased film thicknesses; the films are heated from 200 to 600° C. for 5 to 10 minutes to volatize the organic species and to render the dried "gel" film. While the majority of the organic matter and water is removed from the films heating to 500° C.; the barium titanate film is still only partially crystalline.

The film is preferably further annealed to improve the film's crystallinity. This latter step involves heating the film such as at a rate of 200° C./hr under dry nitrogen to a final annealing temperature of 600 to 900° C., preferably 850° C., until the desired crystallization is achieved. Alternatively, the film can be annealed via rapid thermal annealing (RTA).

Preferred as the titanium alkoxide is titanium isopropoxide. The "barium precursor" is typically the reaction product of a glycol and barium oxide. Typical glycols are ethylene glycol and propylene glycol. The glycol-barium oxide reaction product is typically diluted with an alcohol, glycol ethers and the like prior to the addition of the titanium alkoxide. Suitable alcohols for use as diluents include, without limitation, ethanol, isopropyl alcohol, methanol, butanol and pentanol. Suitable glycol ethers include, but are not limited to, ethylene glycol butyl ether, propylene glycol t-butyl ether, propylene glycol monomethyl ether, propylene glycol monomethyl ether acetate, and propylene glycol butyl ether.

During the sol-gel process, the thickness of the composite is a function of the rotation rate and the viscosity of the solution. Typically, the thickness of the composite is at least 100 nm, more typically at least 250 nm, and still more typically at least 500 nm. A particularly useful thickness is in the range of 450 to 700 nm, and more preferably from 475 to 600 nm. The maximum thickness, for instance of a planar thin film composite, may be determined by the number of sol-gel layers deposited onto the substrate.

In an embodiment, a fine powder of barium oxide is added to the glycol. The reaction is exothermic and the reaction mixture is continuously stirred. The reaction mixture is then diluted with an alkanol, such as 2-propanol. In addition, the titanium alkoxide is then added. To avoid rapid precipitation, the saturated glycol solution is kept at an elevated temperature, preferably 70° C. The solution is then spin coated onto a suitable substrate. In the first stage of spin coating, the solution is added at approximately 2000 rpm for a short duration. In the second stage, the rotation is increased to 4000 rpm for a time sufficient to achieve uniform deposition of film. The film is then dried at a temperature of 80 to 100° C., preferably at 90° C. The product is then subjected to a similar annealing stage as described above.

In another embodiment of the invention, the coating of the substrate is prepared by first dissolving a reaction mixture of alcohol, barium diacetate and titanium alkoxide in ambient atmosphere. The solution of alkanol, acetic acid glycerol is then continuously stirred. Barium acetate is then dissolved in the mixed solution. Titanium alkoxide, such as titanium butoxide, is then added to the solution. The solution is continuously stirred for at least a couple of hours. The solution is then diluted with anhydrous alcohol, such as anhydrous methanol, acetic acid and glycerol in the approximate weight ratio of 5:5:1. The solution is then spin coated onto a suitable substrate, typically a bottom electrode or metal layer. The spinning is preferably done at multiple stages. In the first stage, the solution is applied onto the substrate at approximately 2000 rpm for 10 sec. In the second stage, the solution is applied at a speed of 4000 rpm for a period of time to achieve uniform deposition, generally about ten seconds. The sols may also be applied to the substrate by roller coating or screen printing, among other methods.

Alternatively, the substrate to be coated with the capacitor dielectric may be dipped into the solution at an average speed of 2 to 12 cm/min (1 to 5 in/min) and preferably from 2 to 8 cm/min. The coating is then dried onto the substrate at a temperature of from 200 to 500° C.; typically films are first dried at 200° C. for 2 hours, and then baked at 400° C. for 20 minutes to remove volatile organic materials. Films are then annealed at the temperature range of 600 to 800° C. to improve crystallinity. Typically, the duration of annealing is about one hour.

The dielectric structures of the present invention may contain a single capacitor dielectric layer, or multiple dielectric layers. When multiple capacitor dielectric layers are used, it is preferred that the topmost capacitor dielectric layer, i.e. the dielectric layer to be plated with a conductive layer, has a textured surface. Such multilayer structures preferably comprise a plurality of dielectric layers. In one embodiment, it is further preferred that both the top and bottom dielectric layers in the multilayer dielectric structure have a textured surface.

Particularly suitable multilayer dielectric structures are those having a first or top dielectric layer, a second or middle dielectric layer and a third or bottom dielectric layer, wherein at least one of the top and bottom dielectric layers has textured surfaces. It will be appreciated by those skilled in the art that such middle dielectric layer may comprise a single dielectric layer or a plurality of dielectric layers. Such plurality of dielectric layers allows for the fabrication of a dielectric structure having a tailored overall dielectric constant.

When multiple dielectric layers are used, each of the dielectric layers may be the same or different. In one embodiment, it is preferred that the dielectric layers comprise the same dielectric materials. In an alternate embodiment, it is preferred that different dielectric materials are used to form the various dielectric layers. An example of a suitable combination of different dielectric materials are alternating layers of one or more of alumina, zirconia, barium-strontium-titanate, lead-zirconium-titanate, and lead-lanthanum-zirconium-titanate either by themselves or in combination with one or more other dielectric layers.

In one embodiment, the present textured dielectric layer may be used as the topmost layer in the dielectric stack to improve the adhesion of a subsequently applied layer, such as a metal layer. In this embodiment, the layers under the textured dielectric material may be deposited by any suitable means, such as, but not limited to, sol-gel techniques, chemical vapor deposition, combustion chemical vapor deposition or any combination of these. Such dielectric layers under the textured dielectric layer may be composed of any suitable dielectric material which may be the same as, or different from, the dielectric material used in the textured dielectric layer.

The overall thickness of the dielectric structure depends upon the capacitor dielectric material selected as well as the total capacitance desired. In multilayer dielectric structures, the dielectric layers may be of uniform thickness or varying thickness. Such structures may consist of many thin layers, one or more thick layers or a mixture of thick and thin layers. Such selections are well within the ability of those skilled in the art. Exemplary dielectric layers may have a thickness of 0.01 to 100 $\mu$m.

Such textured surface of the capacitor dielectric material provides increased adhesion for subsequently deposited or plated electrode layers. Typically, the texturing of the dielectric layer surface is sufficient to increase the total surface area of the dielectric layer by at least 5% as compared to the same dielectric layer without such texturing. Preferably, the texturing is sufficient to increase the total surface area by at least 10%, more preferably by at least 15%, still more preferably by at least 20%, and further preferably by at least 25%. The greater the increase in surface area of the dielectric layer, the greater the adhesion of the plated electrode or metallization layer.

Capacitor dielectric surfaces may be textured by a variety of means, including, but not limited to, laser structuring, use of removable porogens, and mechanical means such as physical abrasion. Methods that provide a suitably textured surface while providing control of the resulting dielectric constant are preferred. Thus, laser structuring and use of removable porogens are preferred means of texturing the capacitor dielectric surfaces with the use of removable porogens being more preferred.

Laser structuring of the dielectric surface may be by any laser structuring or ablation methods known in the art. In such methods, the last capacitor dielectric layer applied to the dielectric structure is subjected to laser structuring, such as laser ablation, prior to the deposition of an electrode (metallization) layer. Such laser ablation is typically computer controlled, thus allowing removal of precise amounts of capacitor dielectric material in a predetermined pattern. Such patterns include, without limitations, grooves, dimples, ripples, and cross-hatching.

Preferably, the textured surface is provided by removable porogens. In such method, the porogens, which are incorporated into the capacitor dielectric material, are removed from the capacitor dielectric material prior to deposition of the electrode or conductive layer. Upon removal of the porogens, a capacitor dielectric material having pores, voids, free-volume or other forms of texturing is obtained. Such porogens are particularly suitable for use with sol-gel techniques of capacitor dielectric material deposition, as described above.

A wide variety of removable porogens may be used in the present invention. Any material which can be dispersed within, suspended within, co-dissolved with, or otherwise combined with the capacitor dielectric and subsequently removed from the capacitor dielectric material may suitably be used. Particularly suitable as removable porogens are organic polymers or compounds which can be selectively etched or removed in the presence of the dielectric layer matrix and preferably without adversely affecting the dielectric matrix layer. Preferably, the removable porogen is selected such that it is substantially non-aggregated or nonagglomerated in the capacitor dielectric material. Such non-aggregation or non-agglomeration reduces or avoids the problem of channel formation in the dielectric matrix. It is preferred that the removable porogen is a polymer particle. It is further preferred that the porogen polymer particle is soluble or miscible in the solvent used to deposit the sol.

The removable porogens may be polymers such as linear polymers, star polymers, dendritic polymers and polymeric particles, or may be monomers or polymers that are copolymerized with a dielectric monomer to form a block copolymer having a labile (removable) component or may be high boiling solvents. In an alternative embodiment, the porogen may be pre-polymerized or pre-reacted with the dielectric precursor to form the sol which may be monomeric, oligomeric or polymeric. Such pre-polymerized material is then annealed to form a dielectric layer.

Suitable block copolymers having labile components useful as removable porogens are those disclosed in U.S. Pat. Nos. 5,776,990 and 6,093,636. Such block copolymers may be prepared, for example, by using as pore forming material highly branched aliphatic esters that have functional groups that are further functionalized with appropriate reactive groups such that the functionalized aliphatic esters are incorporated into, i.e. copolymerized with, the vitrifying matrix. Such block copolymers include, but are not limited to, benzocyclobutenes, poly(aryl esters), poly(ether ketones), polycarbonates, polynorbornenes, poly(arylene ethers), polyaromatic hydrocarbons, such as polynaphthalene, polyquinoxalines, poly(perfluorinated hydrocarbons) such as poly(tetrafluoroethylene), polyimides, polybenzoxazoles and polycycloolefins.

Particularly suitable porogens are cross-linked polymer particles, such as those disclosed in U.S. Pat. Nos. 6,271,273 B1 (You et al.) and 6,420,441 (Allen et al.). The polymeric porogens comprise as polymerized units one or more monomers and one or more cross-linking agents. Suitable monomers useful in preparing the porogens include, but are not limited to, (meth)acrylic acid, (meth)acrylamides, alkyl (meth)acrylates, alkenyl (meth)acrylates, aromatic (meth) acrylates, vinyl aromatic monomers, nitrogen-containing compounds and their thio-analogs, substituted ethylene monomers, and aromatic monomers. Such porogens may be prepared by a variety of polymerization methods, including emulsion polymerization and solution polymerization, and preferably by solution polymerization.

Such porogens typically have a molecular weight in the range of 5,000 to 1,000,000, preferably 10,000 to 500,000, and more preferably 10,000 to 100,000. When polymeric particles are used as the porogens, they may be used in any of a variety of mean particles sizes, such as up to 1000 nm. Typical mean particle size ranges are from about 0.5 to about 1000 nm, preferably from about 0.5 to about 200 nm, more preferably from about 0.5 to about 50 nm, and most preferably from about 1 nm to about 20 nm.

The porogen particles are typically cross-linked. Typically, the amount of cross-linking agent is at least about 1% by weight, based on the weight of the porogen. Up to and including 100% cross-linking agent, based on the weight of the porogen, may be effectively used in the particles of the present invention. It is preferred that the amount of crosslinker is from about 1% to about 80%, and more preferably from about 1% to about 60%. A wide variety of cross-linking may be used. Such cross-linking agents are multi-functional monomers and are well-known to those skilled in the art. Exemplary cross-linking agents are disclosed in U.S. Pat. No. 6,271,273 (You et al.).

Porogen particles having a wide range of particle sizes may be used in the present invention. The particle size polydispersity of these materials is in the range of 1 to 20, preferably 1.001 to 15, and more preferably 1.001 to 10. It will be appreciated that particles having a uniform particle size distribution (a particle size polydispersity of 1 to 1.5) or a broad particle size distribution may be effectively used in the present invention.

It will be appreciated by those skilled in the art that the removable porogens may remain dispersed with the gel or may be incorporated into the sol or gel.

The removable porogens are typically added to the sols in an amount sufficient to provide the desired texturing of the capacitor dielectric surface. For example, the porogens may be added to the sols in any amount of from about 1 to about 60 wt %, based on the weight of the sol, preferably from 5 to 50 wt %, more preferably from 10 to 45 wt %, and even more preferably from 10 to 40 wt %.

The porogens may be combined with the ceramic precursors at any stage up to and even during the deposition of the sols to form a film. Such porogens may be combined with the ceramic precursors in any suitable solvent, such as methyl isobutyl ketone, diisobutyl ketone, 2-heptanone, γ-butyrolactone, γ-caprolactone, ethyl lactate propyleneglycol monomethyl ether acetate, propyleneglycol monomethyl ether, diphenyl ether, anisole, n-amyl acetate, n-butyl acetate, cyclohexanone, N-methyl-2-pyrrolidone, N,N'dimethylpropyleneurea, mesitylene, xylenes, or mixtures thereof.

To be useful as porogens in forming the textured capacitor dielectric materials, the porogens of the present invention must be at least partially removable under conditions which do not adversely affect the dielectric material, preferably substantially removable, and more preferably completely removable. By "removable" is meant that the polymer depolymerizes or otherwise breaks down into volatile components or fragments which are then removed from, or migrate out of, the dielectric material yielding pores or voids. Such resulting pores or voids may fill with any carrier gas used in the removal process. Any procedures or conditions which at least partially remove the porogen without substantially degrading the dielectric material, that is, where less than 5% by weight of the dielectric material is lost, may be used. It is preferred that the porogen is substantially removed. Typical methods of removal include, but are not limited to: chemical etching, exposure to heat, pressure or radiation such as, but not limited to, actinic, IR, microwave, UV, x-ray, gamma ray, alpha particles, or electron beam. It will be appreciated that more than one method of removing the porogen or polymer may be used, such as a combination of heat and actinic radiation. It is preferred that the dielectric material is exposed to heat to remove the porogen. It will also be appreciated by those skilled in the art that other methods of porogen removal may be employed.

The porogens of the present invention can be thermally removed under a variety of atmospheres, including but not limited to, vacuum, air, nitrogen, argon, mixtures of nitrogen and hydrogen, such as forming gas, or other inert or reducing atmosphere, as well as under oxidizing atmospheres. Preferably, the porogens are removed under inert or reducing atmospheres. It is preferred that the porogens of the present invention are removed at a temperature at or near that temperature used to form the "gels". Typically, the porogens of the present invention may be removed at a wide range of temperatures such as from 150° to 650° C., and preferably from 300° to 500° C. Such heating may be provided by means of an oven, flame, microwave and the like. It will be recognized by those skilled in the art that the particular removal temperature of a thermally labile porogen will vary according to composition of the porogen. For example, increasing the aromatic character of the porogen and/or the extent of cross-linking will increase the removal temperature of the porogen. Thus, the removal temperature of the porogen may be tailored to the temperature used to form a particular gel. Typically, the porogens of the present invention are removed upon heating for a period of time in the range of 1 to 120 minutes. After removal from the dielectric matrix material, 0 to 20% by weight of the porogen typically remains in the porous dielectric material. Residual porogen remaining will be further removed during the annealing (or crystallization) step of the sol-gel process.

Upon removal of the porogens, a textured dielectric material having voids or other texturing is obtained, where the size of the voids is preferably substantially the same as the particle size of the porogen. In general, pore sizes of up to 1,000 nm, such as that having a mean particle size in the range of 0.5 to 1000 nm, are obtained. It is preferred that the mean pore size is in the range of 0.5 to 200 nm, more preferably from 0.5 to 50 nm, and most preferably from 1 nm to 20 nm.

The resulting dielectric material having voids or other texturing thus has an increased surface area as compared to such material without such voids. Such voids will be dispersed throughout the capacitor dielectric material, including having a fraction at the surface of the material. If only one layer of capacitor dielectric material is used, texturing should not be accomplished through the use of porogens as channels will likely develop which could lead to shorts during subsequent metallization to form the electrodes. Porogens are thus useful to provide a texturized surface in the top capacitor dielectric layer in a multilayer dielectric structure. Preferably, the thickness of the textured dielectric layer is <50% of the total thickness of the dielectric structure. It is further preferred that the thickness of the textured dielectric layer is <40%, more preferably <30% and still more preferably <25% of the total thickness of the dielectric structure. The reduction in dielectric constant caused by the introduction of air voids (with a dielectric constant of 1) is limited by the small volume of the total dielectric material that is so modified.

In an alternate embodiment, the porogen may be a solvent such as an alcohol, provided that such alcohol is sufficiently non-volatile that it at least partially remains in the gel. Neopentyl alcohol is one example, however, other alcohols having similar properties may be used.

FIG. 1 illustrates a multilayer dielectric structure having a plurality of non-textured dielectric layers 5 where the top or first dielectric layer 10 contains surface texturing (pores) 15. Such dielectric structure is prepared by applying a series of sols to a substrate which were then heated to form gel layers. A final sol containing removable polymeric porogen is then applied and the polymeric porogen particles are then thermally removed during the heating step to form the gel. The entire dielectric structure may then be heated to provide the dielectric structure having the desired crystal structure. In an alternate embodiment, the non-porogen containing gel layers are first annealed to form the desired crystallinity, followed by deposition of the porogen-containing sol. The porogen-containing sol is then heated (first annealing) to form the gel and to remove the porogen and form a textured (porous) top dielectric layer. The porous top dielectric layer is then annealed to provide the desired crystallinity.

Electrodes (or conductive layers) may be deposited on the present dielectric structures having a textured surface by a variety of methods, such as, but not limited to, electroless plating, electrolytic plating, chemical vapor deposition, physical vapor deposition and sol-gel deposition. When conductive polymers are used to form the conductive layer, they may be deposited as a melt, in a solvent, by roller coating, as a dry film or by any other polymer coating technique. Electroless plating may suitably be accomplished by a variety of known methods. Suitable metals that can be electrolessly plated include, but are not limited to, copper, gold, silver, nickel, palladium, tin, and lead. Alternatively, a suitable conductive catalyst my be applied to the textured dielectric surface to provide for electrolytic deposition of a suitable conductive electrode material. Preferably, the electrode is deposited by electroless deposition. Such electroless deposition may be followed by electrolytic deposition to build up a thicker metal deposit. The electrolytically deposited metal may be the same as or different from the electrolessly deposited metal.

Figure 2:
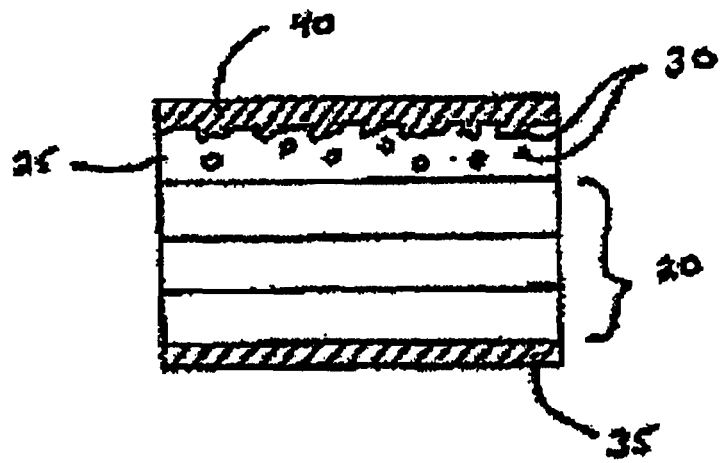
FIG. 2 illustrates a capacitor of the present invention having a first dielectric layer having a textured surface, not to scale.
Figure 3:
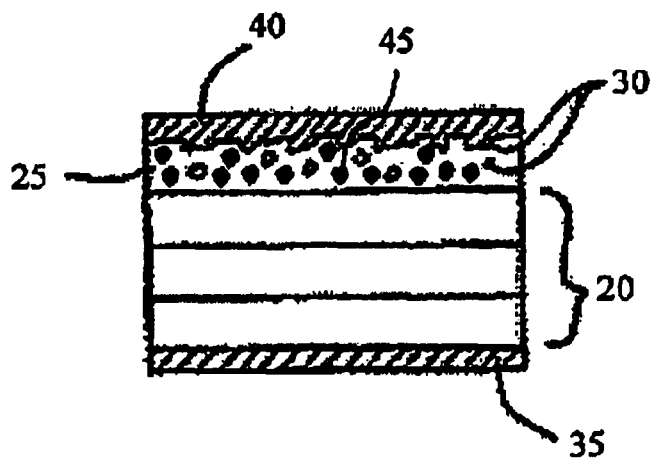
FIG. 3 illustrates a capacitor of the present invention having a first dielectric layer baying a textured surface and a plating dopant, not to scale.

Also contemplated by the present invention is a capacitor comprising a dielectric structure having a bottom surface and a textured top surface, a bottom conductive layer in intimate contact with the dielectric bottom surface and a top conductive layer in intimate contact with the textured top dielectric surface. FIG. 2 illustrates a further alternate embodiment of a capacitor comprising a multilayer dielectric structure having bottom dielectric layers 20 and a top dielectric 25 having a textured surface 30, a bottom conductive layer 35 in intimate contact with the surface of the bottom dielectric layers and a top conductive layer 40 in intimate contact with the textured top dielectric structure surface.

An advantage of the present invention is that the increased surface area of the capacitor dielectric material provides for increased adhesion of the metal layer to the capacitor dielectric. Thus, the present invention provides a method of improving the adhesion of a plated electrode to a dielectric layer comprising the steps of depositing on a substrate a dielectric layer comprising porogen, removing the porogen to provide a dielectric layer having a textured surface, and plating an electrode on the surface of the dielectric layer.

A further advantage of the present invention is that the texturing of the dielectric layer can be controlled to the depth of a single layer in a multilayer dielectric stack. In general, when the textured dielectric layer is the topmost layer of a dielectric stack, the surface of the textured layer is in contact with the dielectric stack is generally planar, but such surface may show texturing.

In another embodiment, the removable porogen is selected such that it preferentially migrates toward the top surface of the dielectric layer during gel formation. In this way, the concentration of removable polymer at or near the surface of the gel is increased as compared to the concentration of the removal porogen in the bulk of the gel. This results in an increase in pores or voids at or near the surface of the dielectric layer upon removal of the porogen. This embodiment provides the texturing at or near the surface of the dielectric layer where it is most needed for improved adhesion of a subsequently deposited metal layer.

In an alternate embodiment, the top dielectric layer may optionally contain a plating dopant. Such plating dopant is any conductive element or compound present in the dielectric layer in an amount sufficient to promote metal plating of the surface of the dielectric layer. Suitable plating dopants include, but are not limited to, metals such as tin, lead, palladium, cobalt, copper, silver, gold and alloys thereof, metal oxides such ma zinc oxide, and mixtures thereof FIG.

3 illustrates a capacitor comprising a multilayer dielectric structure having a bottom dielectric layers 20 and a top dielectric layer 25 having a textured surface 30 and plating dopant 45, a bottom conductive layer 35 in intimate contact with the surface of the bottom dielectric layers and a top conductive layer 40 in intimate contact with the surface of dopant-containing textured top dielectric layer 25.

In another embodiment, the plating dopant may be incorporated into the porogen. By "incorporated" it is meant that the plating dopant is combined with the porogen, copolymerized with the monomers used to from the porogen reacted with the porogen, adsorbed onto the porogen, and encapsulated within the porogen, as well as other possible combinations. In one example, a plating dopant may be encapsulated within the polymeric shell, such as is disclosed in U.S. Pat. No. 5,835,174 (Clikeman et al.). An advantage of incorporating the plating dopant into the porogen is that the plating dopant may be more easily dispersed in the dielectric material and the plating dopant will remain in the pores or voids remaining after removal of the porogen.

The capacitors of the present invention are particularly suitable for use as embedded capacitors in laminated printed circuit boards. Such capacitors are embedded in a laminate dielectric during the manufacture of laminated printed circuit boards. The laminate dielectrics are typically organic polymers such as, but not limited to, epoxies, polyimides, fiber reinforced epoxies and other organic polymers used as dielectrics in printed circuit board manufacture. In general, laminate dielectrics have a dielectric constant $\leq 6$, and typically have a dielectric constant in the range of 3 to 6. The present capacitors may be embedded by a variety of means known in the art, such as those disclosed in U.S. Pat. No. 5,155,655 (Howard et al.).

Accordingly, the present invention provides a method of manufacturing a multilayer printed wiring circuit board including the step of embedding a capacitance material in one or more layers of the multilayer printed circuit board, wherein the capacitance material includes a multilayer dielectric structure including a first dielectric layer and a second dielectric layer wherein the first dielectric layer has a textured surface.

The following examples are presented to illustrate further various aspects of the present invention, but are not intended to limit the scope of the invention in any aspect.

EXAMPLE 1

Barium acetate, $Ba(CH_3COO)_2$, (1 mol) is dissolved in a mixed solution of 20 mol ethanol, 25 mol acetic acid, and 1 mol glycerol, and then the solution is stirred for 2 hr. After stirring, 1 mol of $Ti[O(CH_2)_3CH_3]_4$ is added to the solution, followed by stirring for another 2 hr to prepare a barium titanate sol.

A sample of this sol is spin coated on a conductive substrate at 2000 rpm for 45 sec. After the solution is spin coated, the sample is heated at 170° C. for 1 hr in a nitrogen-gas atmosphere, followed by two steps of successive annealing of 400° C. for 1 hr and 700° C. for 1 hr in air. The thickness of the annealed dielectric sample prepared using this procedure is ~100 nm.

To another sample of the sol is added cross-linked polymeric porogen particles. The porogen particles are added in an amount sufficient to provide 40% porogen by weight, based on the total weight of the sol. The porogen particles contain as polymerized units one or more alkyl (meth) acrylate monomers, one or more additional monomers and divinylbenzene as the cross-linking agent. The porogen-containing sol is then applied to the dielectric surface of the annealed dielectric sample using the conditions disclosed above. The sample is then processed at 400° C. for 1 hr to both form the gel and remove the porogen. Final phase transformation to the perovskite crystal structure is carried out at $\geq 700°$ C. to provide a dielectric structure having a textured surface.

EXAMPLE 2

The textured surface of the dielectric structure of Example 1 is catalyzed and subjected to an electroless nickel plating bath to deposit a layer of nickel on the textured surface. The nickel plated dielectric is next subjected to a nickel electroplating bath to increase the thickness of the nickel deposit.

EXAMPLE 3

The procedure of Example 2 is repeated except that the electrolessly nickel plated dielectric is subjected to a copper electroplating bath to deposit a layer of copper on the electroless nickel layer.

EXAMPLE 4

The procedure of Example 3 is repeated except that the electrolessly nickel plated dielectric is subjected to a silver electroplating bath to deposit a layer of silver on the electroless nickel layer.

EXAMPLE 5

The procedure of Example 2 is repeated except that the electrolessly nickel plated dielectric is subjected to an immersion gold plating bath to deposit a layer of gold on the electroless nickel layer.

EXAMPLE 6

Lead acetate hydrate, $Pb(CH_3COO)_2H_2O$, is dissolved in 2-methoxyethanol and is dehydrated at 110° C. under vacuum to provide lead acetate. A solution of zirconium n-propoxide, $Zr(n-OC_3H_7)_4$, and titanium isopropoxide, $Ti(i-OC_3H_7)_4$ in 2-methoxyethanol is prepared. The zirconium-titanium solution is then added to the lead acetate solution and the mixture is refluxed for 2 to 3 hours at 100° C. and is then distilled to provide a PZT polymer precursor of the formula $Pb(Zr_{0.52}Ti_{0.48})O_3$.

A 0.3M stock solution is prepared by dissolving the polymer in toluene. A sample of this sol is spin coated on a conductive substrate (aluminum) at 2000 rpm for 45 sec. After the solution is spin coated, the sample is dried at 200° C. for 5 to 10 minutes on a hot plate, followed by two steps of successive heating at of 450° C. for 20 minutes and 600° C. for 30 minutes in air. The thickness of the annealed dielectric sample prepared using this procedure is ~100 nm. Cross-linked polymeric porogen particles are then added to another sample of the sol in an amount sufficient to provide 35% porogen by weight, based on the total weight of the sol. The sol is then applied to the surface of the dielectric material on the aluminum substrate using the conditions disclosed above. The sample is then heated at 450° C. for 20 minutes to 1 hour to both form the gel and remove the porogen. Final phase transformation to the perovskite crystal structure is performed at 600° C. to provide a dielectric structure having a textured surface.

EXAMPLE 7

The procedure of Example 6 is repeated except that lanthanum isopropoxide (La(i-OC$_3$H$_7$)$_3$) is also added to the zirconium-titanium solution prior to the combination with the lead acetate solution. A lanthanum doped PZT polymer is obtained.

EXAMPLE 8

The procedure of Example 7 is repeated except that niobium ethoxide (Nb(OC$_2$H$_5$)$_5$) is used instead of lanthanum isopropoxide to provide a niobium doped PZT polymer.

EXAMPLE 9

The procedure of Example 7 is repeated except that the conductive substrate is copper.

EXAMPLE 10

The procedure of Example 6 is repeated except that the conductive substrate is silver.

EXAMPLE 11

A solution of lanthanum nitrate hydrate (La(NO$_3$)$_3$.6H$_2$O) in 2-methoxyethanol is prepared. A second solution of nickel acetate hydrate (Ni(OOCCH$_3$)$_3$.4H$_2$O) in 2-methoxyethanol is prepared. Each compound is then dehydrated and then the solutions are mixed in an amount to provide a stoichiometric ratio of La:Ni of 1:1. This lanthanum nickel sol is then spin coated on the texture surface of the dielectric structure of Example 1 and annealed at 600° C. for 1 hour to provide a lanthanum nickel oxide (LaNiO$_3$) conductive layer. This conductive layer is useful as an electrode.

EXAMPLE 12

The sample of Example 6 is subjected to an electroless copper bath to provide a layer of copper on the textured surface.

EXAMPLE 13

The sample of Example 1 is catalyzed and subjected to an electroless nickel plating bath to deposit a layer of nickel on the textured surface. The nickel plated sample is then contracted with an immersion gold plating bath to provide a gold layer over the nickel layer.

EXAMPLE 14

The procedure of Example 1 is repeated except that a star polymer is used as the porogen.

EXAMPLE 15

The procedure of Example 1 is repeated except that polyethyleneglycol is used as the porogen.

EXAMPLE 16

The sol of Example 1 is prepared but no porogen is added. The sol is spin coated on a platinum foil and heated and annealed to the procedure of Example 1. The surface of the dielectric layer is then subjected to laser ablation to texturize the surface of the dielectric layer. A copper conductive layer is then applied to the textured surface using an electroless copper plating bath.

EXAMPLE 17

The procedure of Example 16 is repeated except that a layer of conductive polymer is applied to the textured dielectric surface as an electrode.

What is claimed is:

1. A capacitor structure comprising a first conductive layer, a second conductive layer and a multilayer dielectric structure disposed between the first and second conductive layers, wherein the multilayer dielectric structure comprises a first dielectric layer and a second dielectric layer, wherein at least one of the first dielectric layer and second dielectric layer comprises pores, wherein the pores have a mean pore size of 0.5 to 1000 nm and wherein the first and second dielectric layers are selected from the group consisting of ceramics, metal oxides and combinations thereof.

2. The capacitor structure of claim 1 wherein the first dielectric layer has pores and has a thickness of <50% of the total thickness of the dielectric structure.

3. The capacitor structure of claim 1 wherein the multilayer dielectric structure has a dielectric constant of $\leq 7$.

4. A printed circuit board comprising the capacitor structure of claim 1 embedded in a laminate dielectric.

5. The capacitor structure of claim 1 wherein at least one of the first dielectric layer and second dielectric layer further comprises a plating dopant.

6. A method of manufacturing a multilayer printed circuit board comprising the step of embedding the capacitor structure of claim 1 in a laminate dielectric in one or more layers of the multilayer printed circuit board.

7. A method of manufacturing the capacitor structure of claim 1 comprising disposing a first dielectric layer on a first conductive layer, disposing a second dielectric layer on the first dielectric layer, wherein at least one of the first and second dielectric layers comprises porogens, disposing a second conductive layer on the second dielectric layer, and removing the porogens to form the pores.

8. The method of claim 7 wherein the porogen is a cross-linked polymer particle.

9. The method of claim 7 further comprising the step of disposing one or more dielectric layers between the first and second dielectric layers.

10. A capacitor structure comprising a conductive substrate and a multilayer dielectric structure comprising a first dielectric layer and a second dielectric layer, wherein the second dielectric layer comprises pores, wherein the pores have a mean pore size of 0.5 to 1000 nm and wherein the first and second dielectric layers are selected from the group consisting of ceramics, metal oxides and combinations thereof.

11. A method of manufacturing a multilayer printed circuit board comprising the step of embedding the capacitor structure of claim 10 in a laminate dielectric in one or more layers of the multilayer printed circuit board.

12. A printed circuit board comprising the capacitor structure of claim 10 embedded in a laminate dielectric.

13. A method of manufacturing the capacitor structure of claim 10 comprising disposing a first dielectric layer on a conductive substrate, disposing a second dielectric layer comprising porogens on the first dielectric layer and removing the porogens to form the pores.

14. The method of claim 13 further comprising the step of disposing one or more dielectric layers between the first and second dielectric layers.

15. The method of claim 13, wherein the first and second dielectric layers are ceramics deposited by a sol-gel technique.

16. The method of claim 15 further comprising the step of annealing the first and second dielectric layers.

17. A capacitor structure comprising a conductive substrate and a multilayer dielectric structure comprising a first dielectric layer and a second dielectric layer wherein the second dielectric layer comprises pores having a mean pore size of 0.5 to 1000 nm and wherein the second dielectric layers are dried sol-gel ceramic films.

18. A capacitor structure comprising a first conductive layer, a second conductive layer and a ceramic dielectric structure disposed between the first and second conductive layers, wherein the ceramic dielectric structure has pores having a mean pore size of 0.5 to 1000 nm.

* * * * *